United States Patent
Kajikawa et al.

(10) Patent No.: US 10,256,432 B2
(45) Date of Patent: Apr. 9, 2019

(54) ORGANIC EL PANEL AND METHOD FOR PRODUCING SAME

(71) Applicant: LUMIOTEC INC., Yonezawa-shi, Yamagata (JP)

(72) Inventors: Fujio Kajikawa, Yonezawa (JP); Joji Suzuki, Yonezawa (JP); Takashi Kawai, Yonezawa (JP); Yuji Yanagi, Yonezawa (JP)

(73) Assignee: LUMIOTEC INC., Yamagata (JP)

( * ) Notice: Subject to any disclaimer, the term of this patent is extended or adjusted under 35 U.S.C. 154(b) by 0 days.

(21) Appl. No.: 15/760,323

(22) PCT Filed: Mar. 6, 2017

(86) PCT No.: PCT/JP2017/008763
§ 371 (c)(1),
(2) Date: Mar. 15, 2018

(87) PCT Pub. No.: WO2017/169536
PCT Pub. Date: Oct. 5, 2017

(65) Prior Publication Data
US 2018/0254428 A1 Sep. 6, 2018

(30) Foreign Application Priority Data
Mar. 31, 2016 (JP) .................................. 2016-071913

(51) Int. Cl.
*H01L 51/52* (2006.01)
*H05B 33/02* (2006.01)
(Continued)

(52) U.S. Cl.
CPC ........ *H01L 51/524* (2013.01); *H01L 51/5246* (2013.01); *H01L 51/5259* (2013.01);
(Continued)

(58) Field of Classification Search
CPC combination set(s) only.
See application file for complete search history.

(56) References Cited

U.S. PATENT DOCUMENTS

2007/0172971 A1* 7/2007 Boroson ............. H01L 51/5246
438/26
2009/0261719 A1 10/2009 Nimura et al.
(Continued)

FOREIGN PATENT DOCUMENTS

JP 2009-259732 A 11/2009
JP 2013-109836 A 6/2013
(Continued)

OTHER PUBLICATIONS

International Search Report, issued in PCT/JP2017/008763, dated May 9, 2017.

*Primary Examiner* — Daniel Whalen
(74) *Attorney, Agent, or Firm* — Birch, Stewart, Kolasch & Birch, LLP

(57) ABSTRACT

In order to provide an organic EL panel, and a method for producing same, that makes it possible to have excellent moisture resistance and ensure sealing substrate-side transparency, provided is an organic EL panel comprising an element formation substrate (1) on which an organic EL element (2) is formed, a sealing substrate (3), and a sealing layer interposed with no gaps between the element formation substrate (1) and the sealing substrate (3), wherein: the sealing layer is constituted of an inner hygroscopic agent (4) covering the organic EL element (2), an outer peripheral hygroscopic agent (5) provided along an outer peripheral edge of the inner hygroscopic agent (4), and a marginal adhesive (6) provided along an outer peripheral edge of the outer peripheral hygroscopic agent (5); the inner hygroscopic agent (4) is constituted of an ultraviolet curable or thermosetting gel-like resin and a desiccant added at a (Continued)

weight ratio of 0.3 to less than 10% to the resin; and the outer peripheral hygroscopic agent (5) is constituted of the aforementioned resin and a desiccant added at a weigh ratio of 10 to 80% to the resin.

8 Claims, 7 Drawing Sheets

(51) Int. Cl.
    *H05B 33/04*     (2006.01)
    *H05B 33/10*     (2006.01)
    *H01L 51/56*     (2006.01)

(52) U.S. Cl.
    CPC ............. *H01L 51/56* (2013.01); *H05B 33/02* (2013.01); *H05B 33/04* (2013.01); *H05B 33/10* (2013.01)

(56) References Cited

U.S. PATENT DOCUMENTS

| | | |
|---|---|---|
| 2011/0052857 A1 | 3/2011 | Suzuki et al. |
| 2014/0311668 A1* | 10/2014 | Yanagi ................ H01L 51/5246 156/273.7 |
| 2016/0005999 A1 | 1/2016 | Lee et al. |
| 2016/0226027 A1* | 8/2016 | Horikawa .............. H05B 33/04 |

FOREIGN PATENT DOCUMENTS

| | | |
|---|---|---|
| WO | WO 2009/139292 A1 | 11/2009 |
| WO | WO 2013/073067 A1 | 5/2013 |
| WO | WO 2015/111525 A1 | 7/2015 |

\* cited by examiner

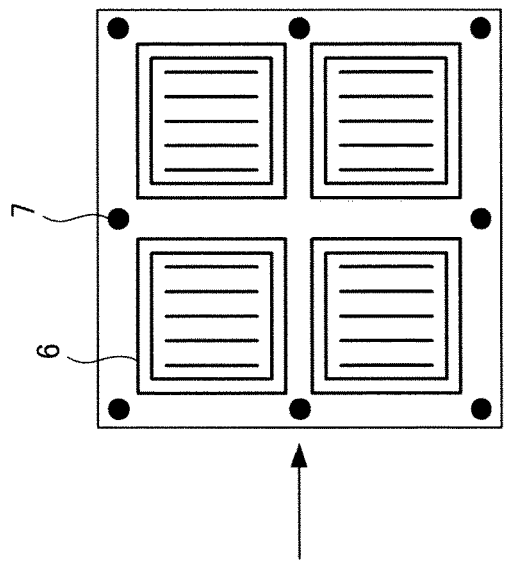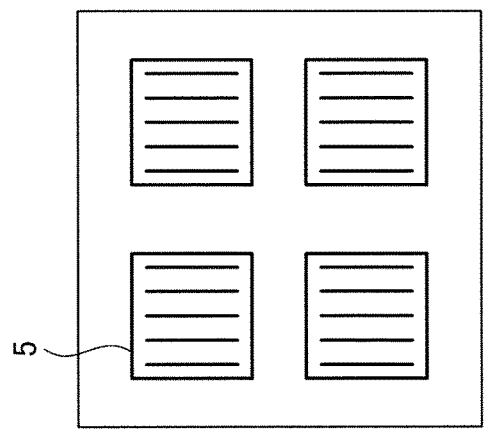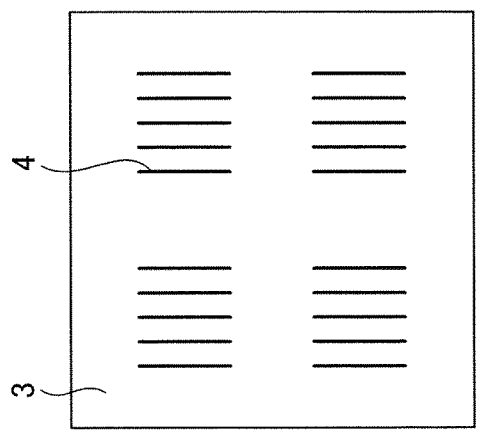

ORGANIC EL PANEL AND METHOD FOR PRODUCING SAME

TECHNICAL FIELD

The present invention relates to an organic EL panel and a method for producing the same.

BACKGROUND ART

An organic EL panel having a gel encapsulation structure has been conventionally publicly known in which an encapsulation layer is provided, without a gap, between a flat encapsulation substrate and an element formation substrate on which an organic EL element is formed, the encapsulation layer including a filler provided in a portion opposed to the organic EL element, a hygroscopic agent provided along an outer peripheral edge of the filler, and a sealing agent provided along an outer peripheral edge of the hygroscopic agent (see, for example, Patent Document 1 listed below).

Moreover, Patent Document 1 describes using a hygroscopic agent as a filler.

PRIOR ART DOCUMENT

Patent Document

Patent Document 1: Japanese Patent Application Publication No. 2013-109836

SUMMARY OF THE INVENTION

Problems to be Solved by the Invention

However, when the filler contains no desiccant, the following problem occurs. Since the organic EL element is extremely vulnerable to moisture, failures such as a dark spot (a fine non-light-emitting portion in a light-emitting area) and edge growth (a phenomenon in which no light is emitted from a light emitting peripheral portion) may occur due to moisture remaining in the filler.

Meanwhile, when the hygroscopic agent is used as the filler, the following problem occurs. When the desiccant is added to the gel or like at a weight ratio of 10% or more and 50% or less as disclosed in Patent Document 1, the haze of the filler (hygroscopic agent) increases and the transparency of the organic EL panel on the encapsulation substrate side decreases.

In view of this, an object of the present invention is to provide an organic EL panel and a method for producing the same which can achieve excellent moisture resistance while securing transparency on the encapsulation substrate side.

Means for Solving the Problems

An organic EL panel according to a first aspect of the present invention for solving the problems described above is characterized in that the organic EL panel includes: an element formation substrate on which an organic EL element is formed; an encapsulation substrate; and an encapsulation layer provided between the element formation substrate and the encapsulation substrate without a gap, the encapsulation layer includes an inner hygroscopic agent covering the organic EL element, an outer periphery hygroscopic agent provided along an outer peripheral edge of the inner hygroscopic agent, and a peripheral adhesive provided along an outer peripheral edge of the outer periphery hygroscopic agent, the inner hygroscopic agent contains an ultraviolet-curable or thermosetting gel resin and a desiccant added to the resin at a weight ratio of 0.3% or more and less than 10%, and the outer periphery hygroscopic agent contains the resin and the desiccant added to the resin at a weight ratio of 10% or more and 80% or less.

An organic EL panel according to a second aspect of the present invention is characterized in that the desiccant has a particle size of 0.95 μm or more and 5 μm or less.

An organic EL panel according to a third aspect of the present invention is characterized in that, in the desiccant, a half width of the particle size in the case where the particle size is expressed in a common logarithm is 0.5 or less.

An organic EL panel according to a fourth aspect of the present invention is characterized in that the resin is made of an oligomer or a polymer which contains organosiloxane or fluorinated polyether in a skeleton.

An organic EL panel according to a fifth aspect of the present invention is characterized in that the desiccant is one or a mixture of two or more of synthetic zeolite, silica gel, calcium oxide, barium oxide, and strontium oxide.

An organic EL panel according to a sixth aspect of the present invention is characterized in that the element formation substrate and the encapsulation substrate are bendable substrates or flexible substrates.

An organic EL panel according to a seventh aspect of the present invention is characterized in that the element formation substrate is a metal substrate and the encapsulation substrate is a piece of transparent resin or glass.

A method for producing an organic EL panel according to an eighth aspect of the present invention is the method for producing an organic EL panel in which an encapsulation layer is provided, without a gap, between an encapsulation substrate and an element formation substrate on which an organic EL element is formed, characterized in that the method includes:

a preparation step of heating and drying a desiccant and a gel resin, adding the desiccant to the resin at a weight ratio of 0.3% or more and 10% or less to form an inner hygroscopic agent which is to be arranged in a portion of the encapsulation substrate opposed to the organic EL element, adding the desiccant to the resin at a weight ratio of 10% or more and 80% or less to form an outer periphery hygroscopic agent which is to be arranged to surround the inner hygroscopic agent, and stirring, cooling, and filtering the inner hygroscopic agent and the outer periphery hygroscopic agent;

an application step of independently applying the inner hygroscopic agent, the outer periphery hygroscopic agent, a peripheral adhesive, and a fixative being an ultraviolet-curable resin in an inert environment in which an amount of moisture is lower than a predetermined amount, the peripheral adhesive being an ultraviolet-curable resin arranged to surround the outer periphery hygroscopic agent;

an alignment step of loading the element formation substrate and the encapsulation substrate into a bonding chamber and aligning the element formation substrate and the encapsulation substrate with the element formation substrate and the encapsulation substrate spaced away from each other;

a heating step of heating the encapsulation substrate on which the inner hygroscopic agent, the outer periphery hygroscopic agent, the peripheral adhesive, and the fixative are applied;

a defoaming step of evacuating the bonding chamber to remove gas entrapped in the inner hygroscopic agent, the outer periphery hygroscopic agent, the peripheral adhesive, and the fixative;

a pressure-bonding step of clamping the element formation substrate and the encapsulation substrate with paired surface plates, pressure-bonding the element formation substrate and the encapsulation substrate with the paired surface plates by applying predetermined load, controlling the load such that an inner portion surrounded by the peripheral adhesive is filled with the inner hygroscopic agent and the outer periphery hygroscopic agent, and forming the encapsulation layer having a predetermined thickness between the element formation substrate and the encapsulation substrate;

a gas introduction step of introducing an inert gas into the bonding chamber to set a surrounding environment of the pressure-bonded element formation substrate and encapsulation substrate to an atmospheric pressure environment;

a temporary fixation step of irradiating the fixative with an ultraviolet ray from a back side of one of the surface plates by using an ultraviolet spot lamp to cure the fixative and temporarily fix the element formation substrate and the encapsulation substrate to each other; and a sealing curing step of irradiating the peripheral adhesive applied on the substrate temporarily fixed in the temporary fixation step with an ultraviolet ray to cure the peripheral adhesive.

Effect of the Invention

According to the organic EL panel of the present invention, it is possible to provide an organic EL panel with excellent moisture resistance and transparency and a method for manufacturing the same.

BRIEF DESCRIPTION OF THE DRAWINGS

FIG. 4A to FIG. 4C are a view illustrating an example of application onto an encapsulation substrate, FIG. 4A is an example of applying an inner hygroscopic agent, part (b) of FIG. 4B is an example of applying an outer periphery hygroscopic agent, FIG. 4C is an example of applying a peripheral adhesive and a fixative.

MODE FOR CARRYING OUT THE INVENTION

An organic EL panel and a method for producing the same according to the present invention are described below with reference to the drawings.

Embodiment

An embodiment of the organic EL panel and the method for producing the same according to the present invention is described by using FIGS. 1A to 7.

Figure 1A:
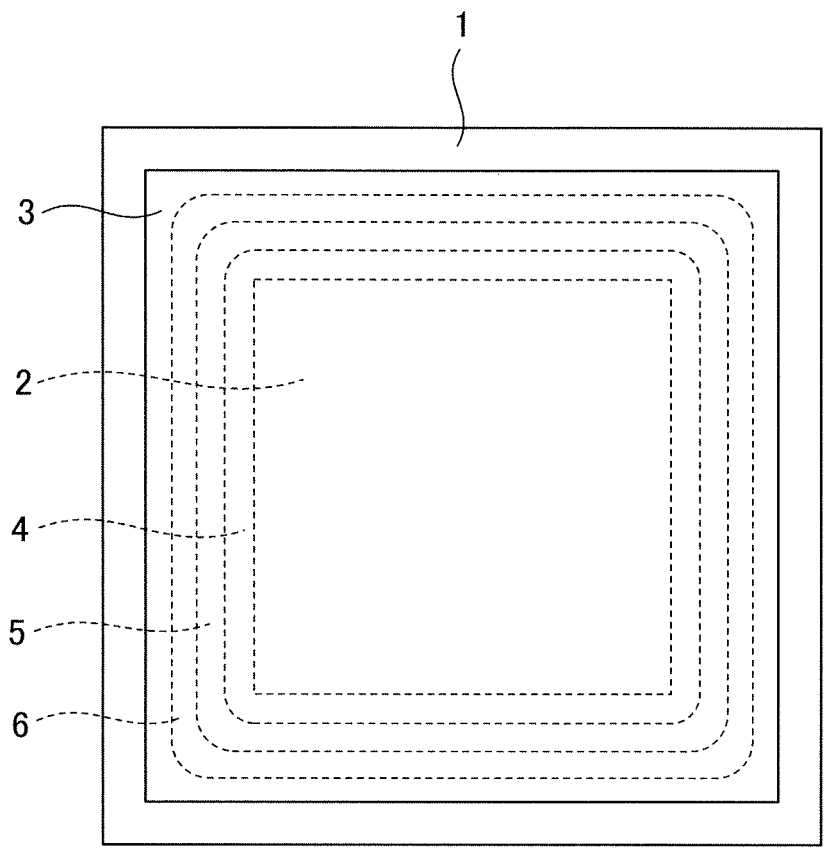
FIG. 1A is a top view schematically illustrating an organic EL panel according to an embodiment of the present invention and FIG. 1B is a side view schematically illustrating a cross-sectional structure of an organic EL panel according an embodiment of the present invention.
Figure 1B:
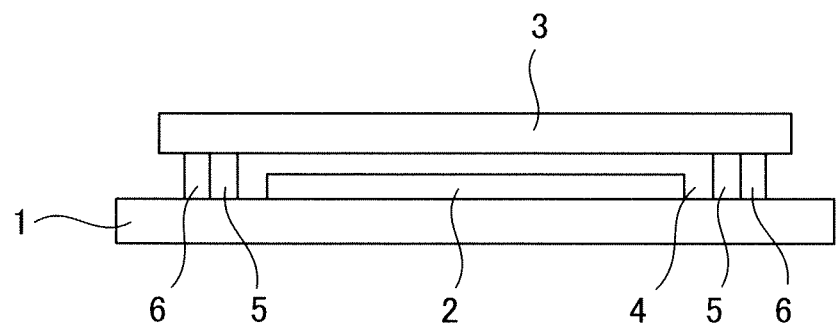

As illustrated in FIGS. 1A and 1B, the organic EL panel according to the embodiment is a transparent panel including an element formation substrate 1, an organic EL element 2, an encapsulation substrate 3, an inner hygroscopic agent 4, an outer periphery hygroscopic agent 5, and a peripheral adhesive 6. Note that the embodiment can be preferably applied to a large panel which has a light emitting area of 80 $cm^2$ or more and which emits light at a luminance of 1000 $cd/m^2$ or more.

The element formation substrate 1 is formed of a transparent plate-shaped body (for example, a piece of glass with ITO electrodes).

The organic EL element 2 includes an anode, an organic light emitting layer, and a cathode which are formed by being stacked on the element formation substrate 1. The anode and the cathode are formed by, for example, patterning a transparent electrically-conductive film (ITO). The organic light emitting layer is formed by, for example, stacking a hole injection layer, a hole transport layer, a light emitting layer, an electron transport layer, and an electron injection layer one on top of another.

The encapsulation substrate 3 is, for example, a flat glass substrate.

The inner hygroscopic agent 4 is an ultraviolet-curable or thermal-setting gel resin (gel material) containing a desiccant at a weight ratio of 0.3% or more and less than 10%. Note that 0.3% which is the lower limit of the weight ratio of the desiccant added to the resin in the inner hygroscopic agent 4 is the minimum weight ratio required to remove moisture remaining in the resin, and 10% which is the upper limit of the weight ratio of the desiccant added to the resin in the inner hygroscopic agent 4 is the weight ratio at which the haze (haze value) of the organic EL panel can be maintained at such a value that the transparency can be surely provided on the encapsulation substrate side.

The outer periphery hygroscopic agent 5 is the ultraviolet-curable or thermal-setting gel resin (gel material) containing the desiccant at a weight ratio of 10% or more and 80% or less.

The peripheral adhesive 6 is an ultraviolet-curable resin with low moisture permeability. The peripheral adhesive 6 is preferably an ultraviolet-curable epoxy adhesive. The peripheral adhesive 6 preferably includes a spacer of 10 μm or more and 100 μm or less. The spacer is made of glass or plastic and has a spherical or columnar shape with a diameter of 12 μm, 50 μm, or the like, and determines the thickness of an encapsulation layer.

The resin described above is an oligomer or polymer which contains organosiloxane (—$R_1R_2SiO$—, where $R_1$ and $R_2$ are saturated or unsaturated alkyl radicals, substituted or unsubstituted phenyl radicals, or saturated or unsaturated fluoroalkyl radicals) or fluorinated polyether (—$CF_2CFYO$—, where Y is F or $CF_3$) in a skeleton.

For example, an oligomer or polymer having a dimethyl siloxane bond (—$(CH_3)_2Si$—) as a skeleton can be preferably used as an oligomer or polymer having an organosiloxane bond (—R$_2$SiO—) as a skeleton. Specifically, SE1880 manufactured by Dow Corning Toray Co., Ltd., KE1057 manufactured by Shin-Etsu Chemical Co., Ltd., or the like can be used.

Moreover, an oligomer or polymer containing [—(R$_1$R$_1$SiO)$_1$—(R$_1$R$_2$SiO)$_m$—(R$_1$R$_3$SiO)$_n$—, where R$_1$ is a methyl radical, R$_2$ is a vinyl radical or a phenyl radical, R$_3$ is a fluoroalkyl radical of —CH$_2$CH$_2$CF$_3$, 1, m, n are integers, and two or less of 1, m, n may be 0] as organosiloxane in the skeleton can be preferably used.

SIFEL8470, 8370 manufactured by Shin-Etsu Chemical Co., Ltd. can be given as examples of the oligomer or polymer which contains fluorinated polyether (—CF$_2$CFYO—, where Y is F or CF$_3$) in the skeleton and which has a functional group containing Si at a terminal.

One or both of synthetic zeolite and silica gel can be used as the desiccant described above. Moreover, inorganic desiccants such as calcium oxide, barium oxide, and strontium oxide can be used. The desiccant preferably has a particle size of 0.95 μm or more and 5 μm or less, and a half width of the particle size in the case where the particle size is expressed in a common logarithm is preferably 0.5 or less. This can facilitate dispersion of the desiccant in the gel resin and prevent formation of aggregates (agglomerates of desiccant) while providing a desired hygroscopic performance (details are described later).

Figure 2:
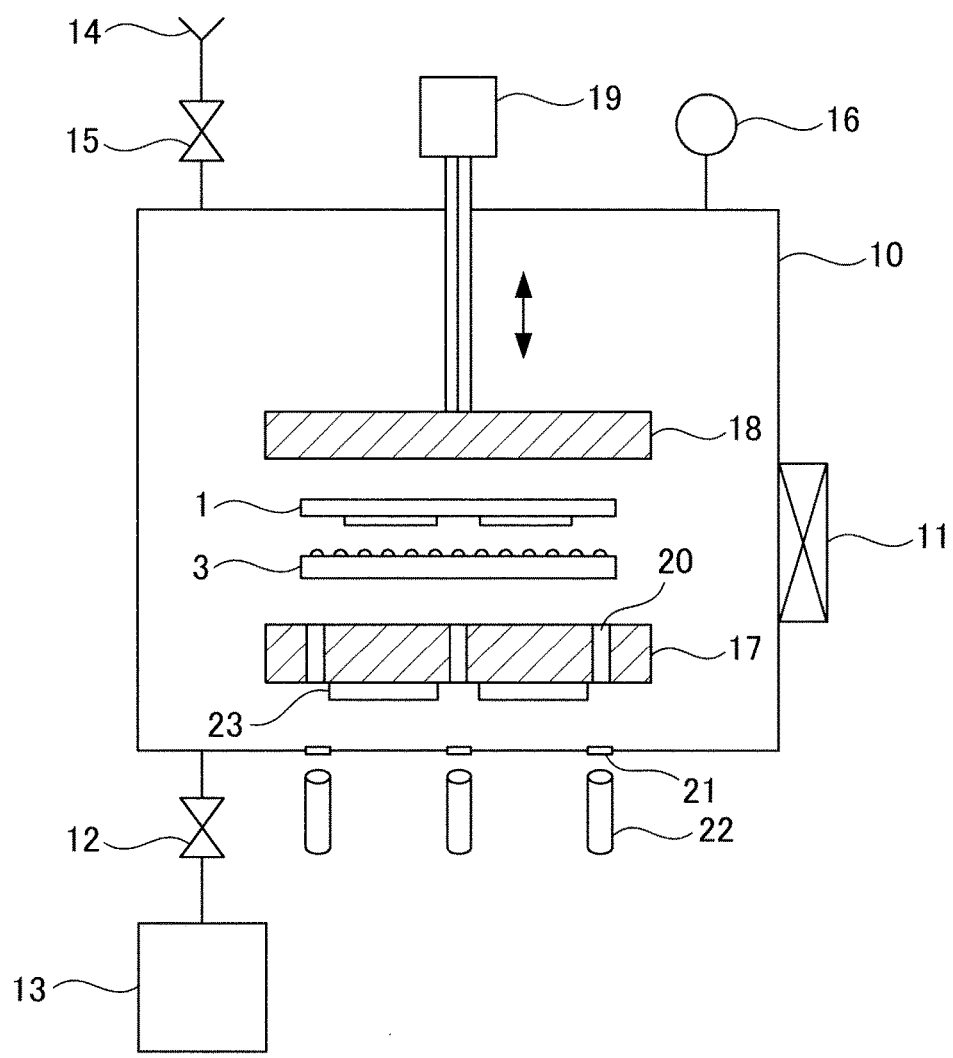
FIG. 2 is a schematic cross-sectional view of an encapsulation apparatus for the organic EL panel according to the embodiment of the present invention.

Next, an apparatus for producing the organic EL panel according to the embodiment is described by using FIG. 2. The apparatus for producing the organic EL panel according to the embodiment includes preparation means, application means, closure means, exhaust means, gas introduction means, alignment means, pressure-bonding means, heating means, temporary fixation means, and sealing curing means.

The preparation means (not illustrated) performs preparation by heating and drying the desiccant and the gel resin, adding the desiccant to the gel resin at a weight ratio of 0.3% or more and 10% or less to form the inner hygroscopic agent 4 which is to be arranged in a portion of the encapsulation substrate 3 opposed to the organic EL element 2, adding the desiccant to the gel resin at a weight ratio of 10% or more and 80% or less to form the outer periphery hygroscopic agent 5 which is to be arranged to surround the inner hygroscopic agent 4, and stirring, cooling, and filtering the inner hygroscopic agent 4 and the outer periphery hygroscopic agent 5.

The application means (not illustrated) applies the inner hygroscopic agent 4, the outer periphery hygroscopic agent 5, the peripheral adhesive 6, and a fixative 7 (see FIGS. 4A to 4C) onto the encapsulation substrate 3 by using a dispenser.

The closure means has a structure which can isolate a bonding chamber 10 from an outside environment. In FIG. 2, a gate valve 11 for loading and unloading the substrates to and from the bonding chamber 10 is provided.

An exhaust valve 12 and a vacuum pump 13 are connected to the bonding chamber 10 as the exhaust means. The exhaust means can evacuate the bonding chamber. Moreover, a vent gas 14, a vent valve 15, and a pressure gauge 16 are connected to the bonding chamber 10 as the gas introduction means. The gas introduction means can control the pressure inside the bonding chamber 10 by introducing an inert gas while detecting the pressure inside the bonding chamber 10 with the pressure gauge 16. The vent gas 14 is an inert gas with a moisture content lower than a predetermined amount. For example, the vent gas 14 is a gas such as a nitrogen gas with a moisture content of 1 ppm or less.

The alignment means (not illustrated) may be means employing high-resolution CCD camera alignment such as a display or mechanical alignment based on an end surface of a glass substrate of about ±100 μm, and can align the element formation substrate 1 and the encapsulation substrate 3 with the element formation substrate 1 and the encapsulation substrate 3 spaced away from each other.

The pressure-bonding means includes paired surface plates (lower surface plate 17 and upper surface plate 18) arranged in the bonding chamber 10, and can control load in vacuum. The lower surface plate 17 and the upper surface plate 18 are arranged parallel to each other to pressure-bond the element formation substrate 1 and the encapsulation substrate 3 to each other. The surface plates are preferably made of an electrically-conductive metal such as steel. Surfaces of the lower surface plate 17 and the upper surface plate 18 which come into contact with the element formation substrate 1 and the encapsulation substrate 3, respectively, are polished to be flat. In the embodiment, a lifting-lowering mechanism 19 is connected to the upper surface plate 18 and the load is controlled by lifting and lowering the upper surface plate 18 with the lifting-lowering mechanism 19. Note that, instead of the upper surface plate 18, the lower surface plate 17 may be the movable surface plate.

The lower surface plate 17 is provided with ultraviolet transmission holes 20 penetrating the lower surface plate 17. The ultraviolet transmission holes 20 are arranged at positions appropriate for selectively irradiating the fixative 7 with ultraviolet rays. A wall surface of the bonding chamber 10 is provided with ultraviolet transmission windows 21. The ultraviolet transmission windows 21 are arranged at such positions that ultraviolet spot lamps 22 can irradiate the fixative with the ultraviolet rays through the ultraviolet transmission holes 20 from the back surface side of the lower surface plate 17. The ultraviolet spot lamps 22 are arranged outside the bonding chamber 10. Note that, in the embodiment, the ultraviolet transmission holes 20, the ultraviolet transmission windows 21, and the ultraviolet spot lamps 22 form the temporary fixation means. The temporary fixation means may be provided on the upper surface plate 18 side.

The heating means include a heater 23 and a thermocouple and can heat the encapsulation substrate 3 to a desired temperature in a controlled manner. In FIG. 2, the planar heater 23 and the thermocouple are arranged to be in contact with the back surface side (opposite side to the surface which comes into contact with the substrate) of the lower surface plate 17. The heating means indirectly heats the encapsulation substrate 3 in a controlled manner by directly heating the lower surface plate 17 with the encapsulation substrate 3 brought into contact with the lower surface plate 17.

The sealing curing means (not illustrated) is provided outside the bonding chamber 10 and cures a sealing material by irradiating the sealing material with an ultraviolet ray.

Figure 3:
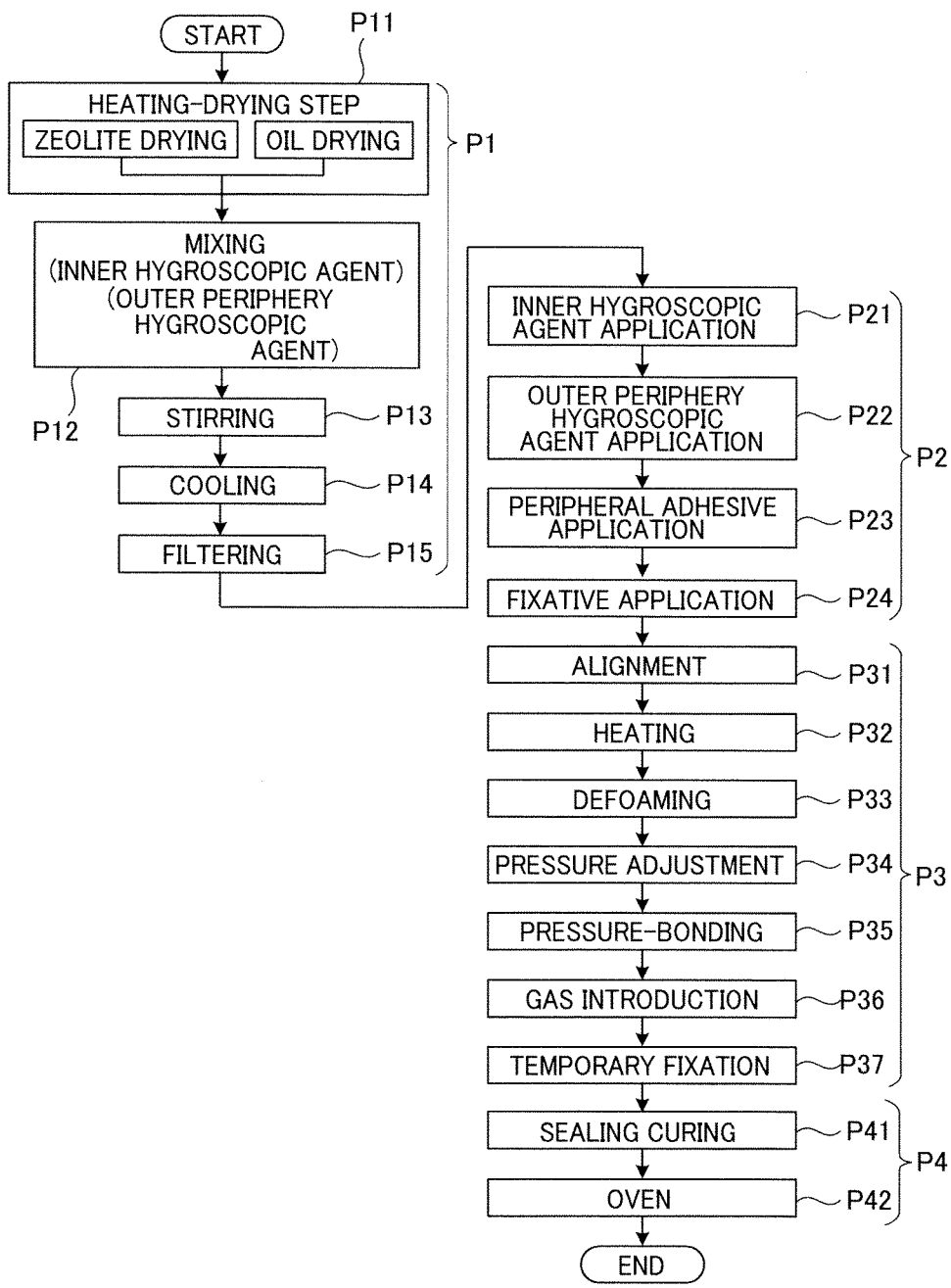
FIG. 3 is a flowchart illustrating a production flow of the organic EL panel according to the embodiment of the present invention.

Next, the method of producing the organic EL panel according to the embodiment is described by using FIG. 3.

As illustrated in FIG. 3, the method of producing the organic EL panel according to the embodiment includes a preparation step P1, an application step P2, a bonding step P3, and a curing step P4. Note that the production method described below is an example in the case where the ultraviolet-curable resin is used as the gel resin forming the inner hygroscopic agent 4 and the outer periphery hygroscopic agent 5.

(Preparation Step)

The preparation step P1 includes a heating-drying step P11, a mixing step P12, a stirring step P13, a cooling step P14, and a filtering step P15.

The preparation step P1 is performed entirely in vacuum or in a low-dew-point environment (preferably, in an environment in which the moisture content is 1 ppm or less).

First, in the heating-drying step P11, the gel resin and the desiccant which are matters to be mixed are each heated and dried in vacuum or the low-dew-point environment.

When the aforementioned resin is, for example, oil, the resin is generally heated and dried in the aforementioned environment at a temperature which is 100° C. or less and at which the structure and characteristics of the matter to be mixed do not change.

Moreover, when the aforementioned desiccant is, for example, zeolite, the desiccant is preferably heated in the aforementioned environment at 400° C. for one to two hours.

In the mixing step P12, the aforementioned resin and the aforementioned desiccant are weighed with an electronic scale or the like such that mixtures with the mix ratio of the inner hygroscopic agent (weight ratio of the desiccant added to the gel resin: 0.3% or more and 10% or less) and the mix ratio of the outer periphery hygroscopic agent (weight ratio of the desiccant added to the gel resin: 10% or more and 80% or less) can be obtained, and are put into cups for mixing.

In the stirring step P13, the matters to be mixed are evenly mixed at each of the aforementioned mix ratios. The stirring step P13 is performed by using a ball mill or a mixer utilizing an impeller or centrifugal force.

An example using a ball mill is specifically described below. First, ceramic balls or the like are put into each of the cups containing the matters to be mixed. This can achieve excellent mixing and eliminate aggregates.

The dimension of the ceramic balls in this case is preferably 1/10 to 1/3 of the diameter of a bottom surface of the cup and the quantity of the ceramic balls is preferably 50 to 90% of the bottom surface area of the cup. Note that a temperature increase occurs due to friction of the mixed matters. However, the temperature needs kept at 40 to 50° C. or less to prevent alternation of the mixed matters and the stirring time is thus set to 3 to 5 minutes.

In the cooling step P14, the mixed matters whose temperature has increased in the stirring step P13 is cooled to stabilize the mixed matters. Work of removing the ceramic balls from the cooled mixed matters is also performed in the cooling step P14.

In the filtering step P15, foreign matters are further removed from the mixed matters mixed in the stirring step P13. The filtering step P15 is generally performed by causing the mixed matters to pass through a fine mesh of about 0.1 to 5 μm.

(Application Step)

The application step P2 includes an inner hygroscopic agent application step P21, an outer periphery hygroscopic agent application step P22, a peripheral adhesive application step P23, and a fixative application step P24.

In the inner hygroscopic agent application step P21, as illustrated in FIG. 4A, the inner hygroscopic agent 4 is applied on a center portion (portion opposed to each of the organic EL elements 2) of the encapsulation substrate 3 in a pattern of parallel intermittent straight lines spaced away from one another or in a helical pattern with even intervals. The inner hygroscopic agent 4 is preferably applied such that a ratio P/R between a diameter R which is the application diameter of the inner hygroscopic agent 4 and an application pitch P is within a range of 8 or more and 16 or less. The inner hygroscopic agent 4 is preferably applied at such positions that a spread width of the inner hygroscopic agent 4 after the pressure bonding is within a distance from an inner peripheral end of the outer periphery hygroscopic agent 5 to an light emitting outer peripheral end of the organic EL element 2.

Note that FIGS. 4A to 4B illustrates an example of a four-pattern substrate in which four organic EL elements 2 are formed on a substrate and four panels can be completed by dividing the substrate.

In the outer periphery hygroscopic agent application step P22, as illustrated in FIG. 4B, the outer periphery hygroscopic agent 5 is applied onto the encapsulation substrate 3 to surround the inner hygroscopic agent 4.

The outer periphery hygroscopic agent 5 is preferably applied at such a position that a spread width of the outer periphery hygroscopic agent 5 after the pressure bonding is within a distance from an inner peripheral end of the peripheral adhesive 6 to the light emitting outer peripheral end of the organic EL element 2.

In the peripheral adhesive application step P23, as illustrated in FIG. 4C, the peripheral adhesive 6 is applied onto the encapsulation substrate 3 to surround the outer periphery hygroscopic agent 5.

In the fixative application step P24, for example, as illustrated in FIG. 4C, the fixative 7 is applied onto the encapsulation substrate 3 in a dot pattern or a linear pattern around the peripheral adhesive 6.

The fixative 7 is assumed to be an ultraviolet-curable resin. The fixative 7 preferably has high adhesive strength and is curable in a short time. For example, the fixative 7 is assumed to be an acryl adhesive or the like. The fixative 7 preferably includes a spacer of 10 μm or more and 100 μm or less. The fixative 7 may be made of the same material as the peripheral adhesive 6.

The aforementioned application step P2 is performed in an inert environment in which the amount of moisture is lower than a predetermined amount. The predetermined amount of moisture is set as appropriate depending on the standards of the organic EL panel to be produced. For example, the inert environment is assumed to be a nitrogen atmosphere whose pressure is the atmospheric pressure and whose moisture content is 1 ppm or less.

Moreover, the dispenser is used for the application of the inner hygroscopic agent 4, the outer periphery hygroscopic agent 5, the peripheral adhesive 6, and the fixative 7. Regarding the application of the inner hygroscopic agent 4, screen printing can achieve higher productivity than the dispenser. However, the screen printing uses a screen printing plate dedicated to the shape and dimensions of the panel. Accordingly, set-up change takes time and the productivity decreases in the case of producing wide variety of panels. Moreover, when the thermosetting resin is used for the inner hygroscopic agent 4, the screen printing has a problem that the viscosity of the resin increases over time and the application thickness varies. Meanwhile, in the case of using the dispenser, although the dispenser alone can only achieve low productivity, the set-up change can be performed instantly by merely selecting a rendering program. Moreover, the screen printing cannot be applied to successive application of the outer periphery hygroscopic agent 5, the peripheral adhesive 6, and the fixative 7 performed after the application of the inner hygroscopic agent 4 and application using the dispenser is essential. Low productivity can be compensated by installing multiple apparatuses. In this case, it is preferable that there is consistency among the same types of apparatuses. The productivity can be increased by increasing the application speed, providing multiple nozzles in the dispenser, providing multiple nozzle heads, providing multiple dispensers, and by other similar methods.

(Bonding Step)

The bonding step P3 includes an alignment step P31, a heating step P32, a defoaming step P33, a pressure adjustment step P34, a pressure-bonding step P35, a gas introduction step P36, and a temporary fixation step P37.

In the alignment step P31, the element formation substrate 1 and the encapsulation substrate 3 are passed through the gate valve 11 and loaded between the lower surface plate 17 and the upper surface plate 18 in the bonding chamber 10. Note that the element formation substrate 1 and the encapsulation substrate 3 are arranged to be opposed to each other such that the surface on which the organic EL elements are formed and the surface on which the inner hygroscopic agent 4 and the like are applied face each other, and are aligned by the alignment means while being spaced away from each other. Although not illustrated, the substrates are held away from each other by a holding mechanism and are aligned by an alignment mechanism.

In the heating step P32, the lower surface plate 17 is heated in advance to 40° C. to 80° C., preferably to 40° C. to 60° C. by using the heater 23 and the thermocouple. This improves the flowability of the application materials including the inner hygroscopic agent 4, the outer periphery hygroscopic agent 5, and the peripheral adhesive 6 and allows the heating of the encapsulation substrate 3 to be started immediately when the encapsulation substrate 3 is brought into contact with the lower surface plate 17.

In the defoaming step P33, after the element formation substrate 1 and the encapsulation substrate 3 are aligned, the gate valve 11 is closed, the exhaust valve 12 is opened, and the bonding chamber 10 is evacuated by the vacuum pump 13 to a pressure within a range of 10 Pa or more and 50 Pa or less. Creating a vacuum in the bonding chamber 10 can remove gas entrapped in the inner hygroscopic agent 4, the outer periphery hygroscopic agent 5, the peripheral adhesive 6, and the fixative 7. However, since additives and low-molecular-weight components contained in the inner hygroscopic agent 4, the outer periphery hygroscopic agent 5, and the peripheral adhesive 6 continue to evaporate and foam in this pressure range, this pressure range is not preferable from the view point of maintaining properties and shapes of the materials. Accordingly, the defoaming step P33 is performed for a predetermined time depending on the materials of the inner hygroscopic agent 4, the outer periphery hygroscopic agent 5, the peripheral adhesive 6, and the fixative 7. The predetermined time is, for example, about 10 to 60 seconds.

In the pressure adjustment step P34, after the defoaming step P33, the exhaust valve 12 is closed and the vent valve 15 is opened to introduce the vent gas (inert gas) 14 into the bonding chamber 10. In this case, the pressure inside the bonding chamber 10 is detected by the pressure gauge 16 and is controlled to be 50 Pa or more and 500 Pa or less, preferably 50 Pa or more and 200 Pa or less. When the pressure inside the bonding chamber 10 is set to 500 Pa and is then reset to the atmospheric pressure (100 kPa), an air bubble entrapped in the inner hygroscopic agent 4 or the like shrinks to 5/1000 of the size at 500 Pa. Moreover, assume a case where some voids are formed inside the encapsulation during the pressure bonding. In this case, the inner hygroscopic agent 4, the outer periphery hygroscopic agent 5, and the peripheral adhesive 6 are uncured and are flowable to no small extent. Accordingly, when the pressure inside the bonding chamber 10 is reset to the atmospheric pressure, the inner hygroscopic agent 4, the outer periphery hygroscopic agent 5, and the peripheral adhesive 6 are pressurized evenly at 100 kPa and the voids shrink to such a degree that they are not visibly recognizable.

In the pressure-bonding step P35, after the pressure adjustment step P34, the vent valve 15 is closed and the upper surface plate 18 is lowered to bring the element formation substrate 1 and the encapsulation substrate 3 into contact with each other and pressure-bond them between the upper surface plate 18 and the lower surface plate 17. In this case, the lower surface plate 17 has been already heated by the heating means 23 and the temperature thereof is controlled by using a not-illustrated temperature adjustment meter. The encapsulation substrate 3 is heated by means of thermal conduction by being brought into contact with the lower surface plate 17 and the viscosities of the inner hygroscopic agent 4, the outer periphery hygroscopic agent 5, and the peripheral adhesive 6 are reduced. Pressure force required to spread the inner hygroscopic agent 4 and the like is thereby reduced. Accordingly, pressure-bonding time is reduced and stress on the organic EL elements 2 is reduced.

The upper surface plate 18 pressure-bonds the element formation substrate 1 and the encapsulation substrate 3 at a predetermined pressure for a predetermined time and spreads the inner hygroscopic agent 4, the outer periphery hygroscopic agent 5, and the peripheral adhesive 6 such that there is no gap. For example, the element formation substrate 1 and the encapsulation substrate 3 are pressure-bonded at a pressure of 5 kPa to 50 kPa for 15 to 60 seconds. In this case, the thickness of the encapsulation layer formed of the inner hygroscopic agent 4, the outer periphery hygroscopic agent 5, and the peripheral adhesive 6 is 10 μm to 100 μm, preferably, 20 μm to 50 μm.

In the gas introduction step P36, after the pressure-bonding step P35, the vent valve 15 is opened to introduce the vent gas 14 and reset the pressure inside the bonding chamber 10 to the atmospheric pressure.

In the temporary fixation step P37, after the gas introduction step P36, the ultraviolet spot lamps 22 irradiate the fixative 7 with ultraviolet rays to cure the fixative 7. For example, when LED UV irradiation devices are used as the ultraviolet spot lamps 22, irradiance energy of 3 W/cm$^2$ is obtained at a wavelength of 365 nm in a diameter of 5 mm. Since the ultraviolet-curable epoxy adhesive cures at 6 J, the fixative 7 cures in several seconds.

(Curing Step)

The curing step P4 includes a sealing curing step P41 and an oven step P42.

In the sealing curing step P41, after the temporary fixation step P37, the temporarily-fixed substrate is passed through the gate valve 11 to be unloaded to the outside of the bonding chamber 10 and then to a normal environment such as a clean room. The temporarily-fixed substrate is set on a simple UV-block mask folder as necessary and introduced into a general-purpose ultraviolet irradiation conveyer to cure the peripheral adhesive 6. Note that the curing of the peripheral adhesive 6 may be performed such that the ultraviolet spot lamps 22 are moved while irradiating the peripheral adhesive 6. In the substrate temporarily-fixed by the fixative 7, the peripheral adhesive 6 is not completely cured but each organic EL element 2 is covered with the inner hygroscopic agent 4 and the outer periphery hygroscopic agent 5 and tightly sealed. Accordingly, the organic EL element 2 is not affected at all even when the temporarily-fixed substrate is in a general environment in which moisture and particles are present.

In the oven step P42, the substrate in which the peripheral adhesive 6 is cured is placed in an oven to perform after curing. The encapsulation is thereby completed. Note that, when the thermosetting resin is used for the inner hygroscopic agent 4 and the outer periphery hygroscopic agent 5, the inner hygroscopic agent 4 and the outer periphery hygroscopic agent 5 are cured by being put into the oven.

Lastly, the bonded substrate is divided and the organic EL panel is completed.

Figure 6:
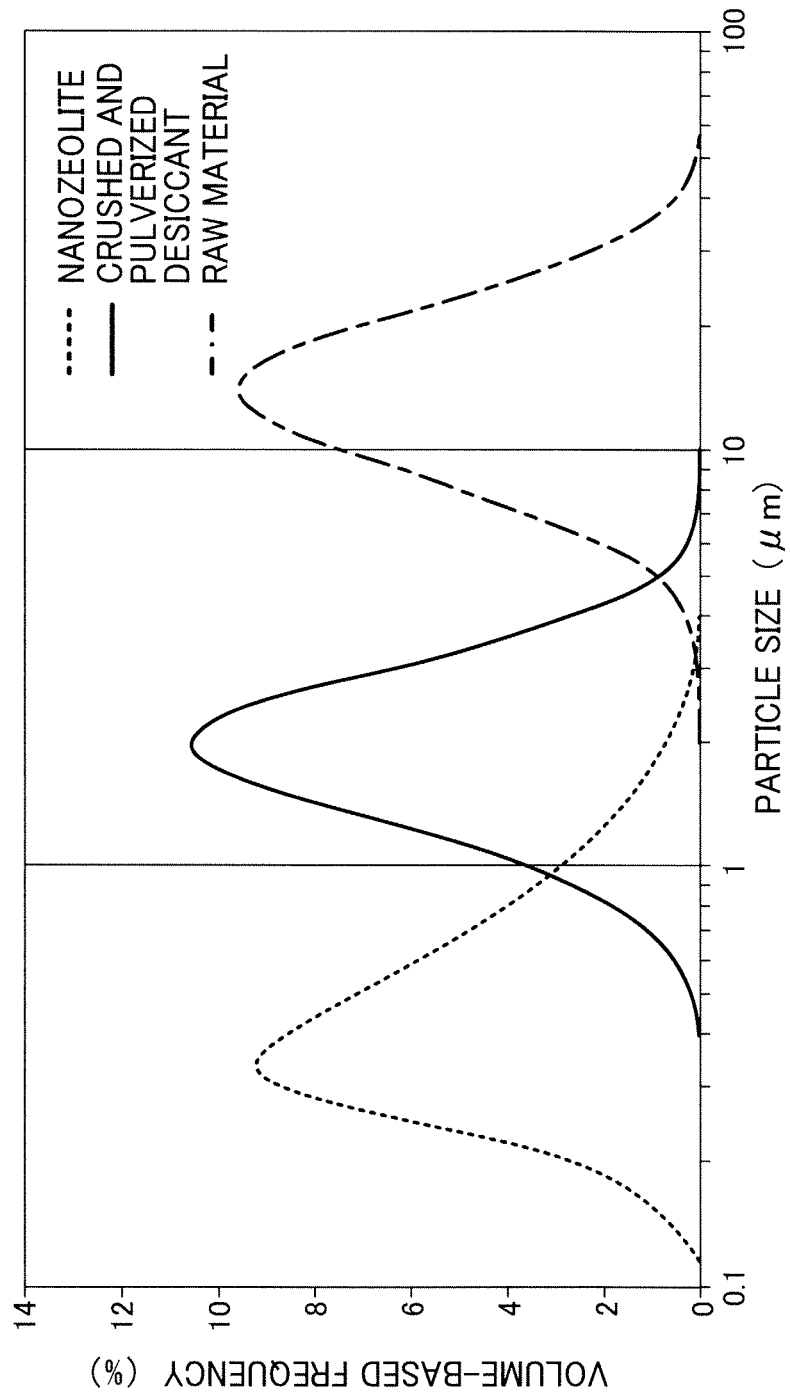
FIG. 6 is a graph illustrating relationships between the particle size and the volume-based frequency of the desiccant.
Figure 7:
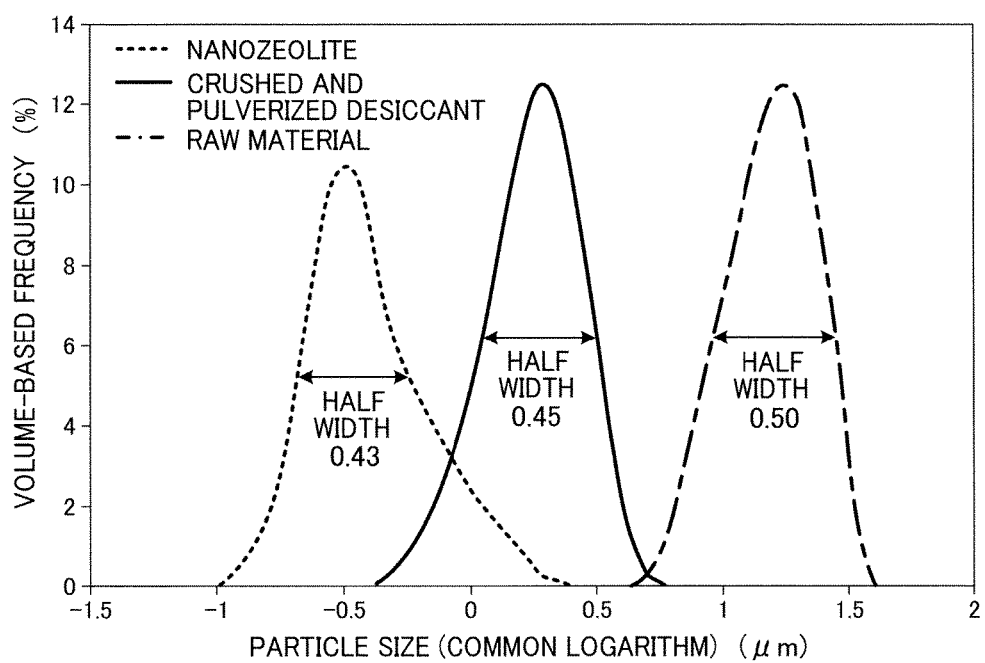
FIG. 7 is a graph illustrating the relationships between the particle size and the volume-based frequency of the desiccant in a common logarithm.

A metal halide lamp which has been conventionally used as an ultraviolet light source is used as means for curing the peripheral adhesive 6. The metal halide lamp generates a large amount of heat and needs to be spaced away from the substrate so as not to thermally affect the organic EL elements 2. Moreover, in order to evenly irradiate a wide range with an ultraviolet ray, the distance between the encapsulation substrate 3 and the ultraviolet light source needs to be large. However, when the distance between the encapsulation substrate 3 and the ultraviolet light source is large, the illuminance of the UV light per unit area is small.

a raw-material of zeolite. FIG. 7 illustrates a graph in which the particle sizes illustrated in FIG. 6 are converted to common logarithms. Table 1 illustrates results of a high-temperature high-humidity storage test performed for the raw-material of zeolite, the desiccant employed in the embodiment, and nanozeolite, In FIGS. 6 and 7, the solid lines correspond to the desiccant employed in the embodiment, the one-dot chain lines correspond to the raw-material of zeolite, and the broken lines correspond to nanozeolite.

Moreover, Table 1 shows results of the test performed under conditions where the temperature was 85 [° C.], the humidity was 85 [%], and the storage time was 240 [hr], and the light emitting state were checked visually. Moreover, d50 in Table 1 is a center particle size (value corresponding to cumulative 50% in the case where the distribution of particle size is expressed in cumulative distribution) and d90 is a particle size of 90% of all particles (value corresponding to cumulative 90% in the case where the distribution of particle size is expressed in cumulative distribution).

TABLE 1

| Type of zeolite | Particle size | | Half width | Light emission observation | | | Overall rating |
|---|---|---|---|---|---|---|---|
| | d50 | d90 | | Initial light emission state | Light emission state after test | Consideration on cause | |
| Raw material | 15 | 25 | 0.50 | Lighting failure | — | Presence of many large particles damaged light emitting portion and short-circuit occurred | x |
| Desiccant of embodiment | 1.7 | 2.9 | 0.45 | Excellent | Excellent | — | o |
| Nanozeolite | 0.4 | 0.95 | 0.43 | Excellent | Dark area was observed in periphery of light-emitting portion | Flocculation of nanozeolite occurred, thereby causing decrease in hygroscopic ability in low-nanozeolite concentration portion, and dark area was formed | x |

High-temperature high-humidity storage test result

Since the ultraviolet-curable epoxy resin has a large curing energy of 6000 mJ or more, ultraviolet curing processing of curing the peripheral adhesive 6 is the processing which takes the most time in the conventional solid encapsulation step.

In the embodiment, only the fixative 7 is cured in a short time after the pressure bonding in the bonding step P3 to temporarily fix the element formation substrate 1 and the encapsulation substrate 3 to each other. This allows the substrate to be unloaded to a general environment with the sealing material being uncured, and the processing time of the bonding step can be reduced. Moreover, the sealing material curing step which takes time can be performed in a general environment by using a general-purpose ultraviolet curing apparatus or a heating apparatus. This enables batch processing in a low-cost facility.

Moreover, the metal halide lamp generates ozone and a large amount of heat. Accordingly, when the metal halide lamp is used in a clean room, it is necessary to discharge ozone and send a large amount of cooling air by using an outside air isolated from the clean room. Hence, the scale of the facility is large.

FIG. 6 is a graph illustrating an example of relationships (frequency distribution) between the particle size (μm) and the volume-based frequency (%) of the desiccant in nanozeolite, the desiccant employed in the embodiment, and As apparent from Table 1, employing the desiccant employed in the embodiment (desiccant obtained by crushing and pulverizing zeolite to a particle size of about 0.4 to 10 μm) indicated by the solid lines in the FIGS. 6 and 7 as the desiccant can facilitate dispersion of the desiccant in the gel resin and prevent formation aggregates while maintaining the desired hygroscopic performance as described above.

On the other hand, when the particle size is greater than 5 μm as in the raw material (particle size: about 2 to 60 μm) indicated by the one-dot chain lines in FIGS. 6 and 7, presence of many large particles causes problems such as damages to the elements which lead short-circuit. Moreover, when the desiccant includes particles with a particle size smaller than 0.4 μm as in nanozeolite (particle size: about 0.1 μm to 4 μm) indicated by the broken lines in FIGS. 6 and 7, the following problems and the like occur. Since the crystal structure is broken in this case, there is a risk of a significant decrease in hygroscopic performance. Moreover, flocculation of zeolite occurs. As a result, hygroscopic performance decreases in a low-zeolite concentration portion and a dark area is formed.

Accordingly, in the embodiment, the desiccant whose particle size is 0.95 μm or more and 5 μm or less and in which the half width (width indicated by the arrow in FIG.

7) of the particle size in the case where the particle size is expressed in a common logarithm is 0.50 μm or less is employed as the desiccant.

In the embodiment configured as described above, the following operations and effects can be obtained.

Figure 5:
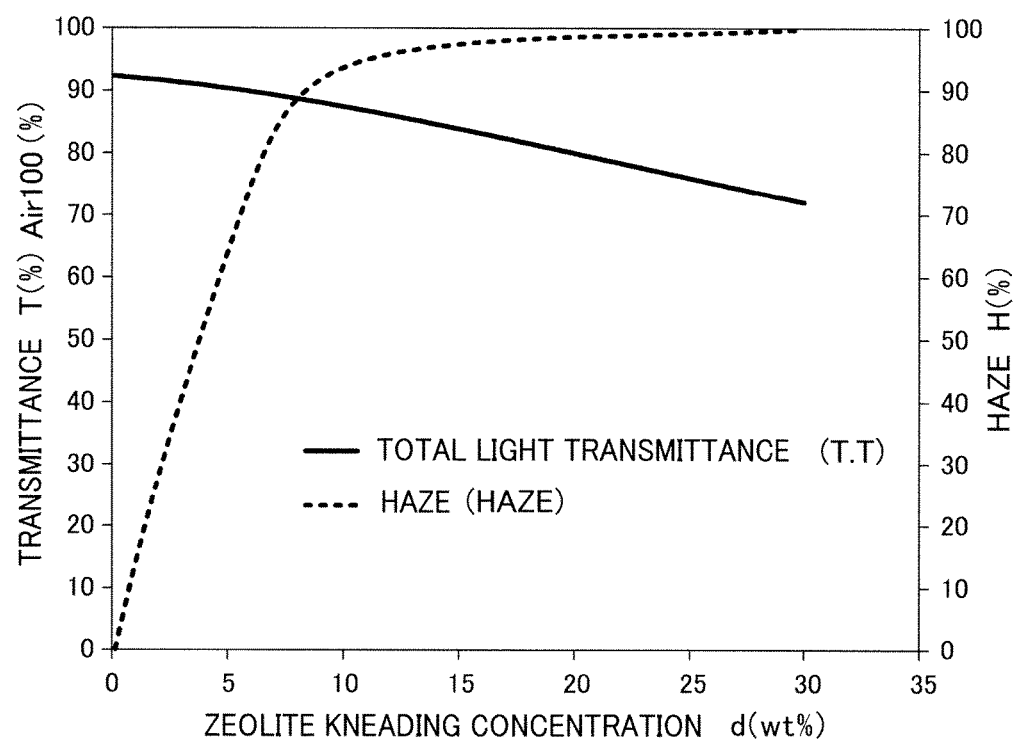
FIG. 5 is a graph illustrating an example of relationships of a weight ratio (wt %) of an added desiccant with transmittance and haze.

First, FIG. 5 illustrates relationships of the weight ratio (wt %) of the desiccant added to the gel resin with the transmittance (%) and the haze (%), as changes in optical characteristics depending on kneading concentration of the zeolite.

Moreover, Table 2 illustrates measured values of total light transmittance and haze in the case where the weight ratio of the desiccant added to the gel resin is set to 0.3%, in the case where the weight ratio is set to 10%, and in blank glass.

TABLE 2

|  | Total light transmittance T.T(%) | Haze (%) |
|---|---|---|
| Added desiccant weight ratio 0.3 (wt %) | 91.5 | 5.0 |
| Added desiccant weight ratio 10 (wt %) | 87.6 | 93.9 |
| Blank glass | 91.6 | 0.3 |

It is found from FIG. 5 and Table 2 that setting the weight ratio of the desiccant added to the gel resin to 0.3% or more and 10% or less can suppress the haze to substantially 94% or less and maintain the total light transmittance at substantially 88% or more. Accordingly, it is found that sufficient transparency is secured in the organic EL panel according to the embodiment.

As described above, the desiccant whose particle size is 0.95 μm or more and 5 μm or less and in which the half width of the particle size in the case where the particle size is expressed in a common logarithm is 0.5 or less is used as the desiccant added to the inner hygroscopic agent 4 with the added weight ratio being 0.3 to 10%, and a double encapsulation structure is achieved by providing the outer periphery hygroscopic agent 5 in which the added weight ratio of the desiccant is 10 to 80% along an outer peripheral edge of the inner hygroscopic agent 4 and by providing the peripheral adhesive 6 along an outer peripheral edge of the periphery hygroscopic agent 5. In this structure, the desiccant contained in the inner hygroscopic agent 4 can absorb moisture in the inner hygroscopic agent 4 and the outer periphery hygroscopic agent 5 and the peripheral adhesive 6 can prevent moisture from entering the organic EL panel from the outside. In addition, the transparency of the inner hygroscopic agent 4 can be secured.

Note that, since the viscosity of the inner hygroscopic agent is low, the larger the area of the panel is (for example, a light-emitting area of 80 cm$^2$ or more), the more facilitated the application thereof is and the greater the cost reduction effect is. Moreover, since the viscosity of the inner hygroscopic agent is low, the application thickness can be made small. This increases the heat dissipation effect and, the larger the area and the higher the luminance of the panel are (for example, a light-emitting area of 80 cm$^2$ or more and luminance of 1000 cd/m$^2$ or more), the more significant the heat dissipation effect is.

Separation of the temporary fixation step and the sealing curing step enables size reduction of a vacuum vessel. Moreover, since the entire surface of the substrate is not irradiated with the ultraviolet ray, the temperature of the substrate does not rise. The ultraviolet spot lamps may use glass fiber light guiding irradiation. Moreover, LED ultraviolet lamps may be used as the ultraviolet spot lamps. In this case, since ozone generation due to unnecessary short wavelength as in the metal halide lamp does not occur, the LED ultraviolet lamps have such an effect that the size of the facility can be made small.

Moreover, ultraviolet curing masks provided for the respective organic EL element shapes have been necessary in the curing step of the sealing material. In the embodiment, since the sealing curing step is separated from the temporary fixation step, there is no need to use the ultraviolet curing mask in the dry or vacuum environment. Accordingly, replacement of the masks in the dry or vacuum environment is unnecessary. This can reduce the time required for evacuation and vent gas introduction and improves the productivity.

Setting of the application diameter and the application pitch of the application material in the embodiment are described.

It is preferable that the application diameter and the application pitch of the inner hygroscopic agent 4 applied in a large amount are large in view of the productivity. However, in this case, a large load is necessary to widely spread the inner hygroscopic agent 4. Moreover, a long time is necessary for pressure bonding and large stress is applied to the elements. The pressure bonding time and the stress on the elements are conflicting characteristics and balance therebetween is important.

Note that, although the example in which the element formation substrate 1 and the encapsulation substrate 3 are the glass substrates is described in the aforementioned embodiment, the element formation substrate 1 and the encapsulation substrate 3 are not limited to the glass substrates and may be bendable substrates or flexible substrates with such flexibility that they can be rolled or subjected to similar deformation.

Moreover, the configuration may be such that the element formation substrate is a metal substrate (for example, a stainless (SUS) substrate or the like) and the encapsulation substrate is a piece of transparent resin or glass. In such a configuration, the gas barrier property is improved compared to the case of using the resin substrate. Accordingly, the effect of improvement in the gas barrier property is more significant in a bendable panel using a bendable substrate or in a flexible panel using a flexible substrate.

INDUSTRIAL APPLICABILITY

The present invention can be applied to an organic EL panel and a method for producing the same.

Moreover, the present invention can be applied to an organic panel EL panel used in a display, a signage, and the like and to a method of producing the same.

EXPLANATION OF THE REFERENCE NUMERALS 1 element formation substrate
2 organic EL element
3 encapsulation substrate
4 inner hygroscopic agent
5 outer periphery hygroscopic agent
6 peripheral adhesive
7 fixative
10 bonding chamber
11 gate valve
12 exhaust valve 13 vacuum pump
14 vent gas
15 vent valve
16 pressure gauge
17 lower surface plate
18 upper surface plate
19 lifting-lowering mechanism
20 ultraviolet transmission hole
21 ultraviolet transmission window
22 ultraviolet spot lamp
23 planar heater

The invention claimed is:

1. An organic EL panel characterized in that the organic EL panel comprises:
   an element formation substrate on which an organic EL element is formed;
   an encapsulation substrate; and
   an encapsulation layer provided between the element formation substrate and the encapsulation substrate without a gap,
   the encapsulation layer includes an inner hygroscopic agent covering the organic EL element, an outer periphery hygroscopic agent provided along an outer peripheral edge of the inner hygroscopic agent, and a peripheral adhesive provided along an outer peripheral edge of the outer periphery hygroscopic agent,
   the inner hygroscopic agent contains an ultraviolet-curable or thermosetting gel resin and a desiccant added to the resin at a weight ratio of 0.3% or more and 10% or less, and
   the outer periphery hygroscopic agent contains the resin and the desiccant added to the resin at a weight ratio of 10% or more and 80% or less.

2. The organic EL panel according to claim 1, characterized in that the desiccant has a particle size of 0.95 µm or more and 5 µm or less.

3. The organic EL panel according to claim 2, characterized in that, in the desiccant, a half width of the particle size in the case where the particle size is expressed in a common logarithm is 0.5 or less.

4. The organic EL panel according to claim 3, characterized in that the resin is made of an oligomer or a polymer which contains organosiloxane or fluorinated polyether in a skeleton.

5. The organic EL panel according to claim 1, characterized in that the desiccant is one or a mixture of two or more of synthetic zeolite, silica gel, calcium oxide, barium oxide, and strontium oxide.

6. The organic EL panel according to claim 1, characterized in that the element formation substrate and the encapsulation substrate are bendable substrates or flexible substrates.

7. The organic EL panel according to claim 1, characterized in that the element formation substrate is a metal substrate and the encapsulation substrate is a piece of transparent resin or glass.

8. A method for producing an organic EL panel in which an encapsulation layer is provided, without a gap, between an encapsulation substrate and an element formation substrate on which an organic EL element is formed, characterized in that the method comprises:
   a preparation step of heating and drying a desiccant and a gel resin, adding the desiccant to the resin at a weight ratio of 0.3% or more and 10% or less to form an inner hygroscopic agent which is to be arranged in a portion of the encapsulation substrate opposed to the organic EL element, adding the desiccant to the resin at a weight ratio of 10% or more and 80% or less to form an outer periphery hygroscopic agent which is to be arranged to surround the inner hygroscopic agent, and stirring, cooling, and filtering the inner hygroscopic agent and the outer periphery hygroscopic agent;
   an application step of independently applying the inner hygroscopic agent, the outer periphery hygroscopic agent, a peripheral adhesive, and a fixative being an ultraviolet-curable resin in an inert environment in which an amount of moisture is lower than a predetermined amount, the peripheral adhesive being an ultraviolet-curable resin arranged to surround the outer periphery hygroscopic agent;
   an alignment step of loading the element formation substrate and the encapsulation substrate into a bonding chamber and aligning the element formation substrate and the encapsulation substrate with the element formation substrate and the encapsulation substrate spaced away from each other;
   a heating step of heating the encapsulation substrate on which the inner hygroscopic agent, the outer periphery hygroscopic agent, the peripheral adhesive, and the fixative are applied;
   a defoaming step of evacuating the bonding chamber to remove gas entrapped in the inner hygroscopic agent, the outer periphery hygroscopic agent, the peripheral adhesive, and the fixative;
   a pressure-bonding step of clamping the element formation substrate and the encapsulation substrate with paired surface plates, pressure-bonding the element formation substrate and the encapsulation substrate with the paired surface plates by applying predetermined load, controlling the load such that an inner portion surrounded by the peripheral adhesive is filled with the inner hygroscopic agent and the outer periphery hygroscopic agent, and forming the encapsulation layer having a predetermined thickness between the element formation substrate and the encapsulation substrate;
   a gas introduction step of introducing an inert gas into the bonding chamber to set a surrounding environment of the pressure-bonded element formation substrate and encapsulation substrate to an atmospheric pressure environment;
   a temporary fixation step of irradiating the fixative with an ultraviolet ray from a back side of one of the surface plates by using an ultraviolet spot lamp to cure the fixative and temporarily fix the element formation substrate and the encapsulation substrate to each other; and
   a sealing curing step of irradiating the peripheral adhesive applied on the substrate temporarily fixed in the temporary fixation step with an ultraviolet ray to cure the peripheral adhesive.

* * * * *